(12) United States Patent
Benoit et al.

(10) Patent No.: US 12,154,837 B2
(45) Date of Patent: Nov. 26, 2024

(54) SEAMLESS INTERCONNECT THRESHOLDS USING DIELECTRIC FLUID CHANNELS

(71) Applicant: Sciperio, Inc, Orlando, FL (US)

(72) Inventors: Jason Benoit, Orlando, FL (US); Nicholas Willey, Orlando, FL (US); Paul I. Deffenbaugh, Orlando, FL (US); Casey W. Perkowski, Winter Park, FL (US); Samuel LeBlanc, Orlando, FL (US); Evan McDowell, Orlando, FL (US); Kenneth H. Church, Orlando, FL (US)

(73) Assignee: SCIPERIO, INC, Orlando, FL (US)

( * ) Notice: Subject to any disclaimer, the term of this patent is extended or adjusted under 35 U.S.C. 154(b) by 385 days.

(21) Appl. No.: 17/573,874

(22) Filed: Jan. 12, 2022

(65) Prior Publication Data
US 2022/0238401 A1    Jul. 28, 2022

Related U.S. Application Data

(60) Provisional application No. 63/140,542, filed on Jan. 22, 2021.

(51) Int. Cl.
*H01L 23/13* (2006.01)
*H01L 21/48* (2006.01)
*H01L 23/00* (2006.01)

(52) U.S. Cl.
CPC .......... *H01L 23/13* (2013.01); *H01L 21/4803* (2013.01); *H01L 24/32* (2013.01);
(Continued)

(58) Field of Classification Search
CPC ..... H01L 23/13; H01L 21/4803; H01L 24/32; H01L 24/73; H01L 24/83; H01L 24/92; H01L 24/24; H01L 24/29; H01L 24/82; H01L 2224/24227; H01L 2224/29194; H01L 2224/838; H01L 2224/831; H01L 2224/82101; H01L 2224/92244; H01L 2224/73267; H01L 2224/82939; H01L 2224/92; H01L 2224/83191; H01L 2224/32221
(Continued)

(56) References Cited

U.S. PATENT DOCUMENTS 8,790,742 B2    7/2014    Church et al.
10,259,081 B2   4/2019    MacDonald et al.
(Continued)

OTHER PUBLICATIONS

A. C. W. Lu et al., "Modeling and characterization of wire bonding for RF applications," in Proc. 52nd Electron. Compon. Technol. Conf., May 2002, pp. 905-909.
(Continued)

*Primary Examiner* — Jasmine J Clark
(74) *Attorney, Agent, or Firm* — Goodhue, Coleman & Owens, P.C.

(57) ABSTRACT

A method may include forming a cavity within a plastic structure with a channel positioned at a perimeter of the cavity, inserting the electronic component into the cavity, dispensing a dielectric fluid into the channel at the perimeter of the cavity, curing the dielectric fluid in situ to secure the electronic component within the cavity with a cured dielectric and printing interconnects for the electronic component.

22 Claims, 9 Drawing Sheets

(52) U.S. Cl.
CPC .............. *H01L 24/73* (2013.01); *H01L 24/83* (2013.01); *H01L 24/92* (2013.01); *H01L 24/24* (2013.01); *H01L 24/29* (2013.01); *H01L 24/82* (2013.01); *H01L 2224/24227* (2013.01); *H01L 2224/29194* (2013.01); *H01L 2224/32221* (2013.01); *H01L 2224/73267* (2013.01); *H01L 2224/82101* (2013.01); *H01L 2224/82939* (2013.01); *H01L 2224/831* (2013.01); *H01L 2224/83191* (2013.01); *H01L 2224/83192* (2013.01); *H01L 2224/838* (2013.01); *H01L 2224/92244* (2013.01); *H01L 2924/15157* (2013.01)

(58) Field of Classification Search
USPC ........................................................ 438/118
See application file for complete search history.

(56) References Cited

U.S. PATENT DOCUMENTS

| | | | |
|---|---|---|---|
| 10,748,867 B2 | 8/2020 | Wicker et al. | |
| 2007/0170228 A1* | 7/2007 | Zhao | B81B 7/0074 228/102 |
| 2020/0243474 A1* | 7/2020 | Jung | H01L 24/32 |

OTHER PUBLICATIONS

A. Ghannam, C. Viallon, D. Bourrier, and T. Parra, "Dielectric microwave characterization of the SU-8 thick resin used in an above ic process," in Proc. Eur. Microw. Conf. (EuMC), Sep./Oct. 2009, 5 pages.
A. R. Varkani, Z. H. Firouzeh, and A. Z. Nezhad, "Equivalent circuit model for array of circular loop FSS structures at oblique angles of incidence," IET Microw., Antennas Propag., vol. 12, No. 5, pp. 749-755, Apr. 2018.
A. Sutono, N. G. Cafaro, J. Laskar, and M. M. Tentzeris, "Experimental modeling, repeatability investigation and optimization of microwave bond wire interconnects," IEEE Trans. Adv. Packag., vol. 24, No. 4, pp. 595-603, Nov. 2001.
B. K. Tehrani and M. M. Tentzeris, "Fully inkjet-printed ramp interconnects for wireless Ka-band MMIC devices and multi-chip module packaging," in Proc. 48th Eur. Microw. Conf. (EuMC), Sep. 2018, pp. 1037-1040.
B. K. Tehrani, B. S. Cook, and M. M. Tentzeris, "Inkjet-printed 3D interconnects for millimeter-wave system-on-package solutions," in IEEE MTT-S Int. Microw. Symp. Dig., May 2016, pp. 1-4.
B. K. Tehrani, C. Mariotti, B. S. Cook, L. Roselli, and M. M. Tentzeris, "Development, characterization, and processing of thin and thick inkjetprinted dielectric films," Organic Electron., vol. 29, pp. 135-141, Feb. 2016. [Online]. Available: http://www.sciencedirect.com/science/ article/pii/S1566119915302032.
B. K. Tehrani, R. A. Bahr, W. Su, B. S. Cook, and M. M. Tentzeris, "E-band characterization of 3D-printed dielectrics for fully-printed millimeter-wave wireless system packaging," in IEEE MTT-S Int. Microw. Symp. Dig., Jun. 2017, pp. 1756-1759.
B. S. Cook, J. R. Cooper, and M. M. Tentzeris, "Multi-layer RF capacitors on flexible substrates utilizing inkjet printed dielectric polymers," IEEE Microw. Wireless Compon. Lett., vol. 23, No. 7, pp. 353-355, Jul. 2013.
B. Zhang and H. Zirath, "A metallic 3-D printed e-band radio front end," IEEE Microw. Wireless Compon. Lett., vol. 26, No. 5, pp. 331-333, May 2016.
C. Armiento, S. Trulli, A. Akyurtlu, E. Harper, M. Haghzadeh, and C. Laighton, "Printed electronics and additive packaging for microwave applications," in Proc. Int. Conf. Electron. Packag. (ICEP), Apr. 2017, p. 1-2.
D. Jahn, R. Reuter, Y. Yin, and J. Feige, "Characterization and modeling of wire bond interconnects up to 100 GHZ," in Proc. IEEE Compound Semiconductor Integr. Circuit Symp., Nov. 2006, p. 111-114.
E. MacDonald et al., "3D printing for the rapid prototyping of structural electronics," IEEE Access, vol. 2, pp. 234-242, 2014.
F. X. Röhrl, J. Jakob, W. Bogner, R. Weigel, and S. Zorn, "Bare die connections via aerosol jet technology for millimeter wave applications," in Proc. 48th Eur. Microw. Conf. (EuMC), Sep. 2018, pp. 1033-1036.
G. P. Le Sage, "3D printed waveguide slot array antennas," IEEE Access, vol. 4, pp. 1258-1265, 2016.
G. Pascariu, P. Cronin, and D. Crowley, "Next generation electronics packaging utilizing flip chip technology," in Proc. IEEE/CPMT/SEMI 28th Int. Electron. Manuf. Technol. Symp. (IEMT), Jul. 2003, p. 423-426.
I. Ndip et al., "Modelling the shape, length and radiation characteristics of bond wire antennas," IET Microw., Antennas Propag., vol. 6, No. 10, p. 1187-1194, Jul. 2012.
I. Ndip, A. Ö, H. Reichl, K. D. Lang, and H. Henke, "Analytical models for calculating the inductances of bond wires in dependence on their shapes, bonding parameters, and materials," IEEE Trans. Electromagn. Compat., vol. 57, No. 2, pp. 241-249, Apr. 2015.
J. Huang and S. W. Lee, "Tri-band frequency selective surface with circular ring elements," in Antennas Propag. Soc. Symp. Dig., vol. 1, Jun. 1991, p. 204-207.
J. Lim, D. Kwon, J. S. Rieh, S. W. Kim, and S. W. Hwang, "RF characterization and modeling of various wire bond transitions," IEEE Trans. Adv. Packag., vol. 28, No. 4, pp. 772-778, Nov. 2005.
J. Veres et al., "Additive manufacturing for electronics 'Beyond Moore,'" in IEDM Tech. Dig., Dec. 2016, 3 pages.
M. T. Craton, J. D. Albrecht, P. Chahal, and J. Papapolymerou, "A chipfirst approach to millimeter-wave circuit packaging," IEEE Microw. Wireless Compon. Lett., p. 1-3, 2019.
S. Pavlidis, B. Wright, and J. Papapolymerou, "3-D printed substrates for MMIC packaging," in Proc. IEEE Radio Wireless Symp. (RWS), Jan. 2017, p. 79-82.
T. Krems, W. Haydl, H. Massler, and J. Rudiger, "Millimeter-wave performance of chip interconnections using wire bonding and flip chip," in IEEE MTT-S Int. Microw. Symp. Dig., vol. 1, Jun. 1996, p. 247-250.
T. Merkle and R. Götzen, "Millimeter-wave surface mount technology for 3-D printed polymer multichip modules," IEEE Trans. Compon., Packag., Manuf. Technol., vol. 5, No. 2, p. 201-206, Feb. 2015.
T. Merkle, R. Götzen, J. Y. Choi, and S. Koch, "Polymer multichip module process using 3-D printing technologies for D-band applications," IEEE Trans. Microw. Theory Techn., vol. 63, No. 2, p. 481-493, Feb. 2015.
Xuanke He et al., Additively Manufactured mm-Wave Multichip Modules With Fully Printed "Smart" Encapsulation Structures, IEEE Transactions on Microwave Theory and Techniques, vol. 68, No. 7, pp. 2716-2721, Jul. 2020.

* cited by examiner

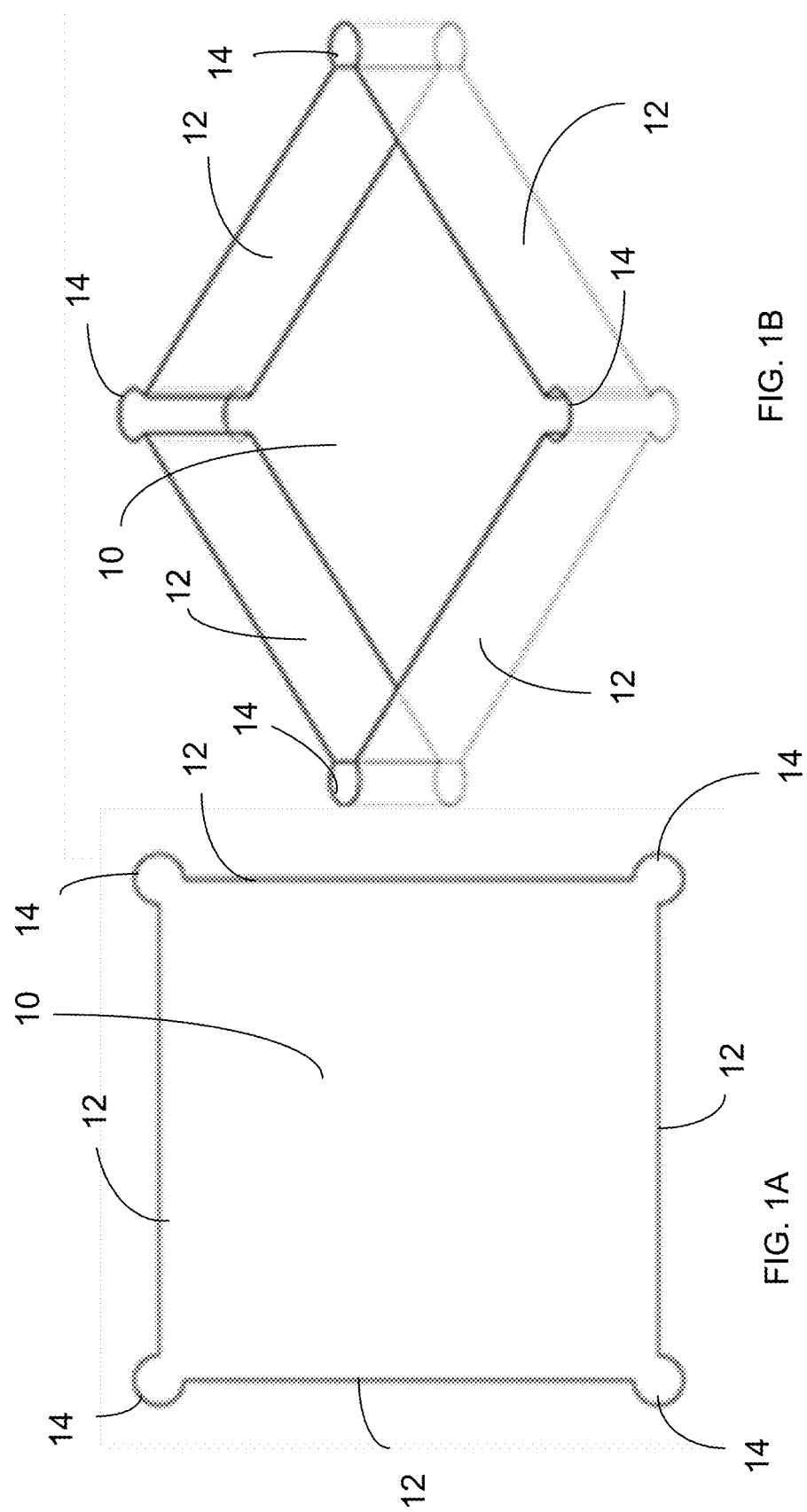

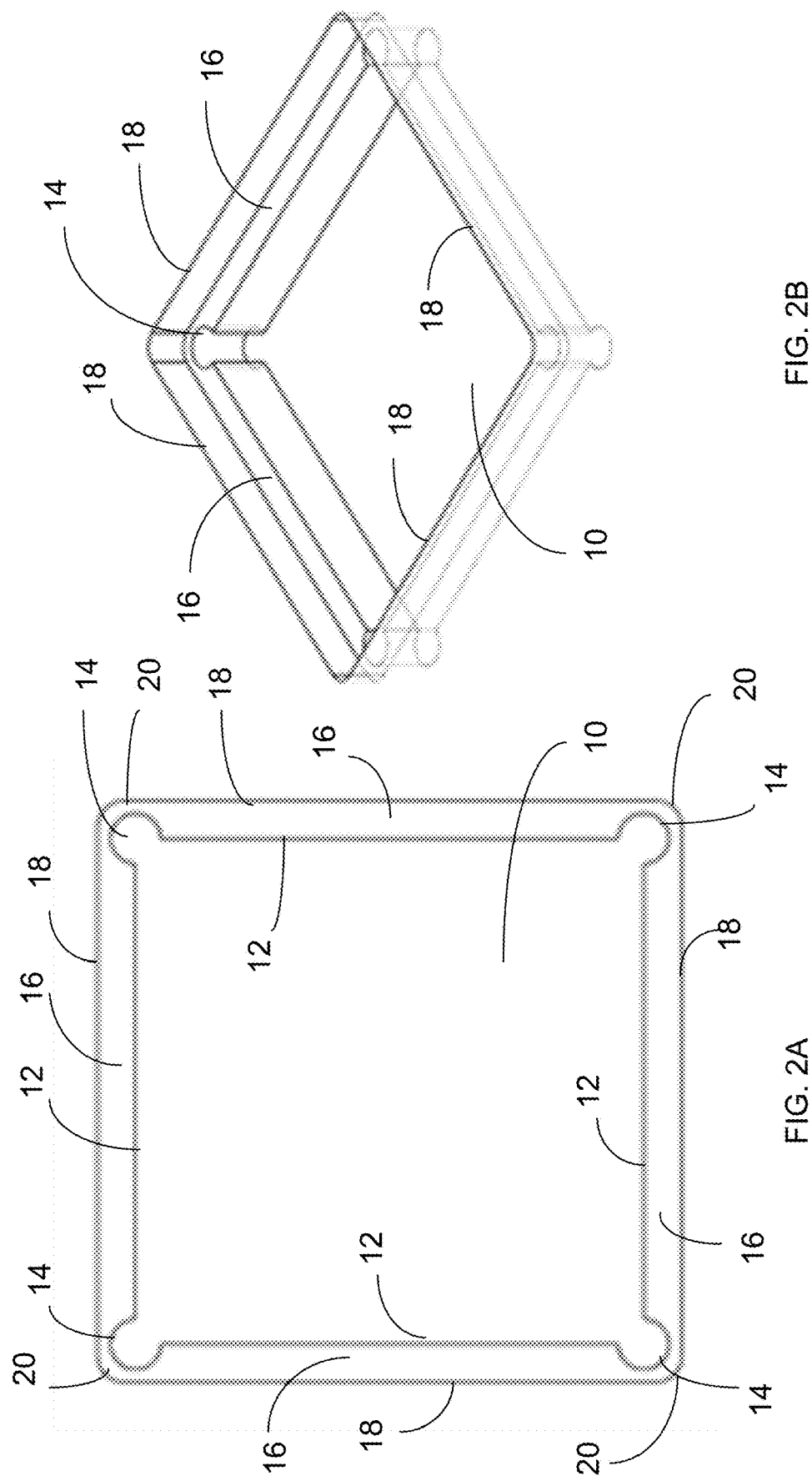

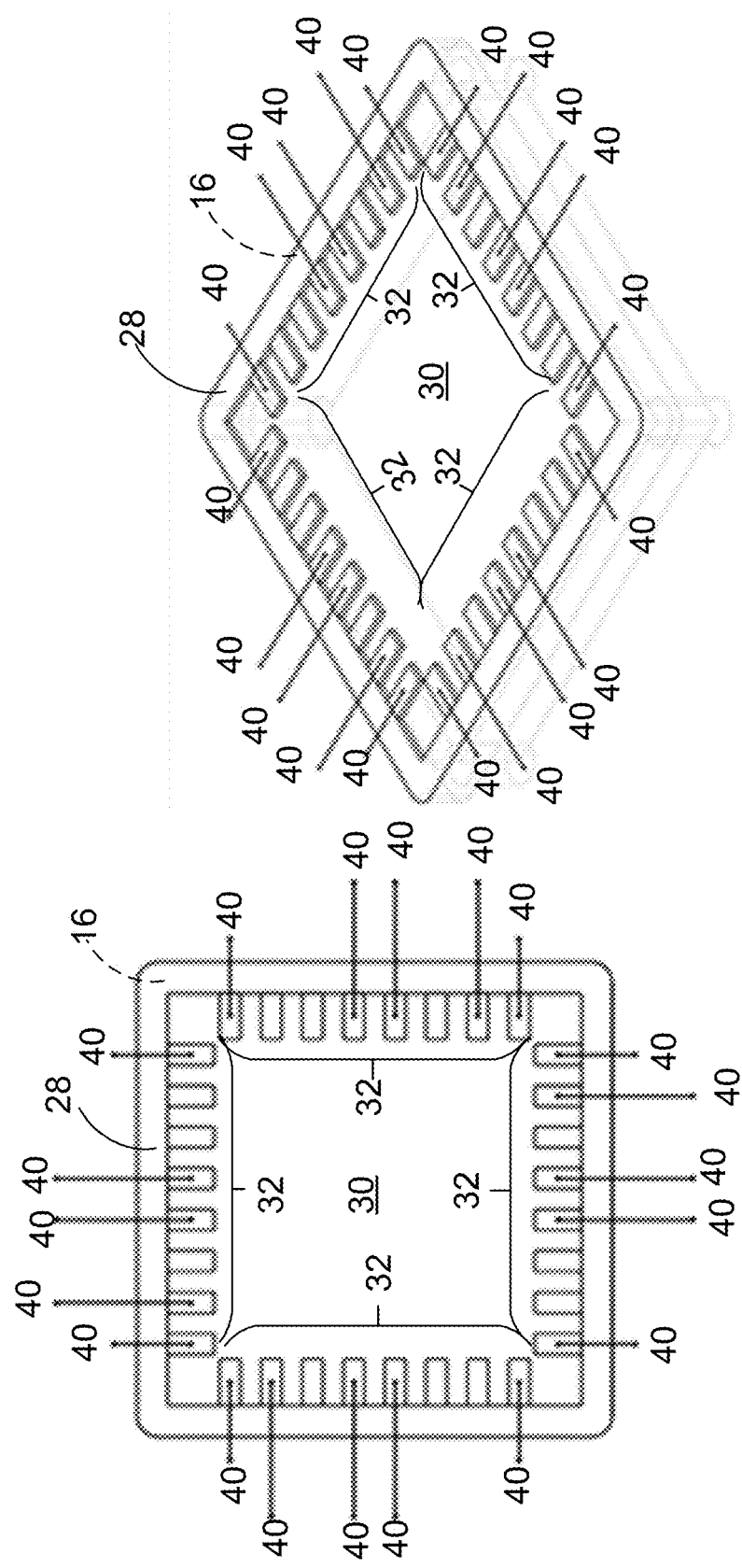

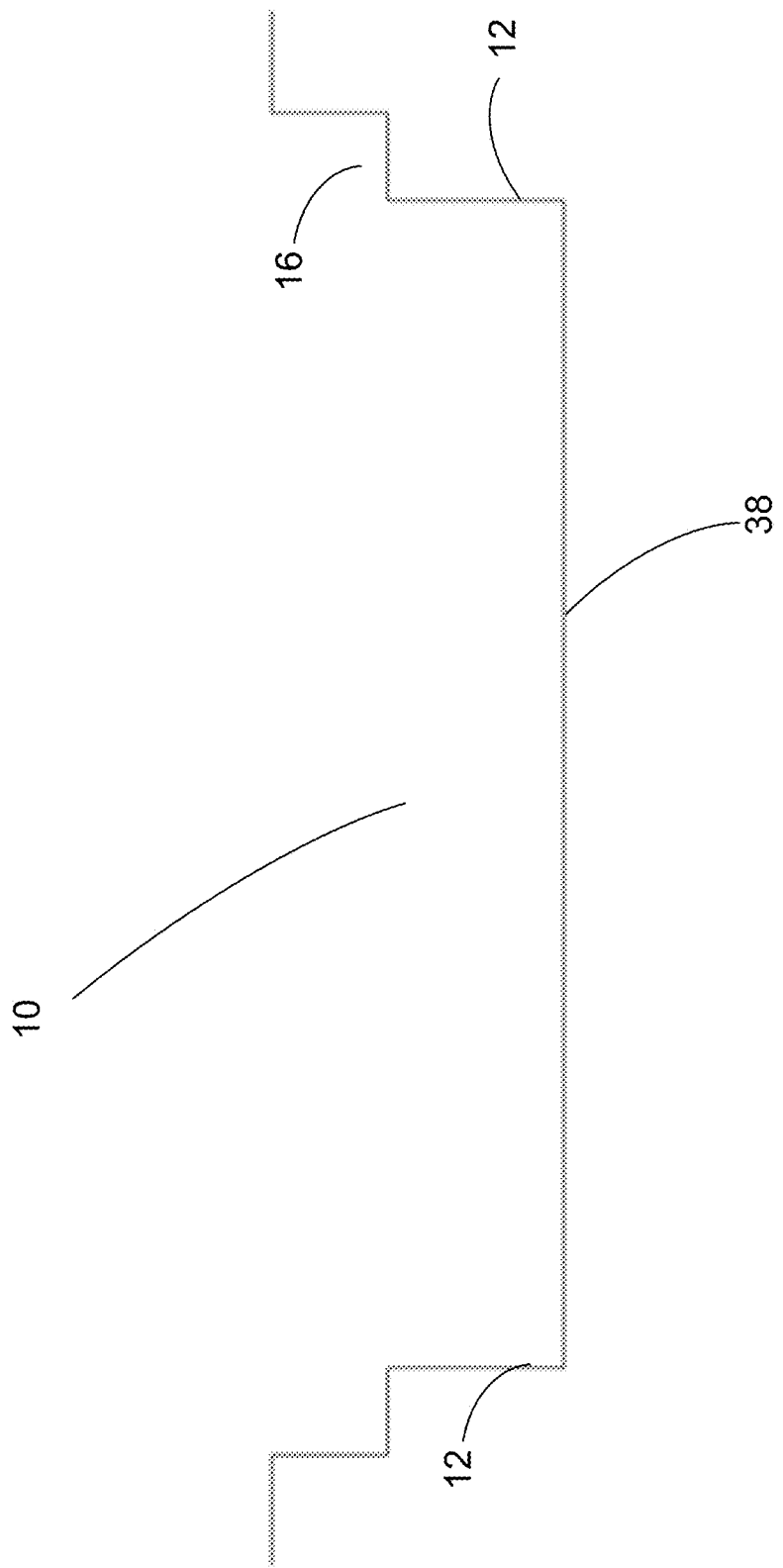

SEAMLESS INTERCONNECT THRESHOLDS USING DIELECTRIC FLUID CHANNELS

RELATED APPLICATIONS

This application claims priority to U.S. Provisional Patent Application No. 63/140,542 filed Jan. 22, 2021, hereby incorporated by reference in its entirety.

FIELD OF THE INVENTION

The present invention relates to electronic components. More particularly, but not exclusively, the present invention relates to providing seamless interconnect thresholds for electronic components using dielectric fluid channels.

BACKGROUND

Active and passive components require interconnects to electrically or mechanically connect to a circuit or system. There are numerous methods to hold components or devices on structures, but these lack the mechanical properties and form factors to stay secure in normal and harsh conditions.

Fabricating structural devices with diverse components can be performed by mounting the components on top and adding adhesive to hold them in place or by creating a cavity that allows the components to be buried. The buried approach has several advantages, but the cavity must be made large enough to allow the component to drop in or be firmly pressed in. Moreover, dropping or pressing still leaves gaps around the edge. Even where the gap is small such as microns to hundreds of microns in distance, the gap allows movement of the component during use.

For example, electrical, mechanical, optical, or electro-mechanical components, such as chips, die, MEMS, sensors, passives, and actives are often required in additively manufactured (AM) circuits. These components may be integrated into AM structures by using printed cavities. For example, the QFN style component would then be placed into the cavity with its pads facing up. Interconnects would then be dispensed from the chip pad, across the interconnect gap, and onto the adjacent board. This method subjects the interconnects to many issues. Cracking is prevalent since the interconnects bridge over free space. Electrical shorts can occur when conductive flows down into the interconnect gap. Additionally, securing the chip relies on either mechanical fitment or the usage of adhesive, which is not typically integrated in DDM processes.

What is needed are methods and apparatus to improve interconnects.

SUMMARY

Therefore, it is a primary object, feature, or advantage of the present invention to improve over the state of the art.

It is a further object, feature, or advantage of the present invention to improve interconnects associating with components.

It is a still further object, feature, or advantage of the present invention to enhance the ruggedness of interconnects of components and allow them to maintain secure connection even in harsh conditions.

Another object, feature, or advantage is to provide a methodology which allows for eliminating gaps.

Yet another object, feature, or advantage is to eliminate issues associated with printing cavities including printing inconsistencies at perimeters of cavities such as over extrusion, under extrusion, and gaps.

A further object, feature, or advantage is to eliminate issues associated with printing cavities such as increasingly poor cavity tolerances as the size of the cavity decreases.

A still further object, feature, or advantage is to eliminate issues associated with printing cavities such as the inability to form cavities in an orientation other than normal to the print head.

Another object, feature, or advantage is to provide for cavity edges which are clean and sharp and are extremely repeatable.

Yet another object, feature, or advantage is to provide for tight tolerancing for a cavity down to minimum cavity sizes possible with a given mill bit.

A further object, feature, or advantage is to provide for forming of cavities in surfaces that might not be printed normal to a print head such as on the side of a printed cylinder, sphere, or other structure.

A still further object, feature, or advantage is to improve the ability to use direct digital manufacturing (DDM).

Another object, feature, or advantage is to remove the requirement of a tight mechanical fitment of a chip to thereby make pick and place operations easier.

Yet another object, feature, or advantage is to provide a tight platform that allows for directly printing conductive lines to component pads.

A further object, feature, or advantage is to provide methods which may be used with a variety of different electronic components including active components, passive components, bare dies, optical components, micro electromechanical devices, sensors, and other types of electronic components.

One or more of these and/or other objects, features, or advantages of the present invention will become apparent from the specification and claims that follow. No single embodiment need provide each and every object, feature, or advantage. Different embodiments may have different objects, features, or advantages. Therefore, the present invention is not to be limited to or by any objects, features, or advantages stated herein.

One aspect of the present disclosure relates to a method for securely mounting an electronic component. The method may include forming a cavity within a plastic structure with a channel positioned at the perimeter of the cavity. The method may include inserting the electronic component into the cavity. The method may include filling the channel with a liquid. The method may include curing the liquid in situ such that the liquid hardens to provide a hardened liquid. The method may include printing, using a conductive material, at least one interconnect for the electronic component which extends from a component interface of the electronic component across the channel filled with the hardened liquid.

Another aspect provides a method for mounting an electronic component. The method may milling a cavity within a plastic structure, milling a channel into a perimeter of the cavity, inserting the electronic component into the cavity, dispensing a dielectric fluid into the channel at the perimeter of the cavity, curing the dielectric fluid in situ to secure the electronic component within the cavity with a cured dielectric, and printing interconnects for the electronic component wherein the interconnects extend from a component interface of the electronic component across the channel filled with the cured dielectric.

BRIEF DESCRIPTION OF THE DRAWINGS

Illustrated embodiments of the disclosure are described in detail below with reference to the attached drawing figures, which are incorporated by reference herein.

FIG. 1A is a top view of a milled chip cavity.

FIG. 1B is a perspective view of the milled chip cavity.

FIG. 2A is a top view showing a channel milled into the perimeter of chip cavity.

FIG. 2B is a perspective view of the channel milled into the perimeter of the chip cavity.

FIG. 5A is a top view of chip interconnects dispensed over a UV-cured channel.

FIG. 5B is a perspective view of the chip interconnects dispensed over the UV-cured channel.

FIG. 6 is a cross-sectional view showing the milled chip cavity with the channel milled into the perimeter of the chip cavity such as shown in FIGS. 2A and 2B.

DETAILED DESCRIPTION

Figure 3B:
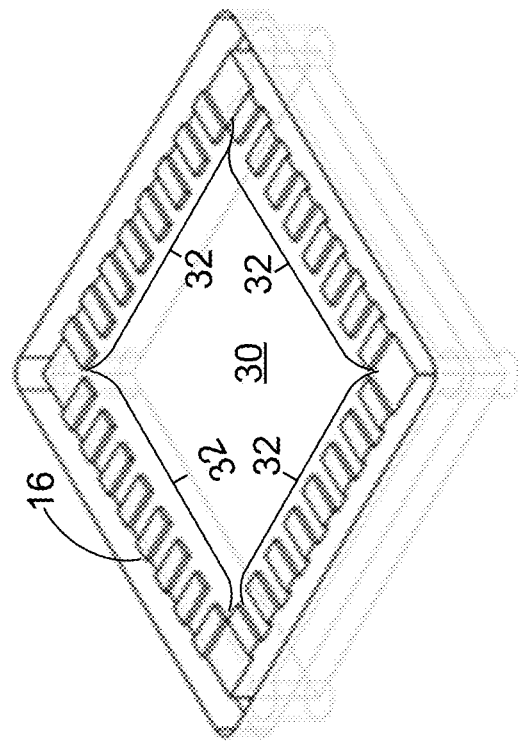
FIG. 3B is a perspective view showing the chip inserted into the cavity.

The present invention provides for seamless interconnect thresholds by creating a cavity through milling for the electronic component and filling any gaps between the electronic component and the cavity. Filling the gap gives two advantages: one is a firm fit and the second is printing conductive or other lines to pads for interconnects. Filling the gap can be done by several methods including, but not limited to: 1) printing an adhesive dot in the cavity and pressing the component in which will then seep up and around the component filling the gap and securing the component, 2) dropping or pressing the component and then printing an adhesive pattern around the component filling the gap, 3) printing an adhesive dot on the underside of the component and pressing it in, 4) a shallow cavity in which the component will be partially buried and then using one of the three methods to fill the gap and create a small ramp to print conductive materials to the pads, and 5) filling the gap and printing more crude patterns on the component and then using a laser to pattern or eliminate unwanted conductive material for clean edges.

According to one aspect, methods may be performed using a direct digital manufacturing machine equipped with polymer deposition, conductive paste deposition, and subtractive milling as features. A program may be written to generate a mill path operation based on user-input dimensions and settings. The mill path may then subtractively cut a cavity intended for electrical component placement into a plastic structure. A channel may then be milled into the perimeter of the cavity using a second feature of the aforementioned mill generation program. The electrical component may then be inserted, and UV-curable dielectric fluid may be dispensed into the channel and cured in-situ with a UV lamp. Interconnects may then be then printed using silver ink starting from the component interface, across the cured dielectric threshold, and onto the adjoining board and connected to relevant traces.

The ability to provide seamless dielectric interconnect thresholds described herein addresses various interconnect problems and makes other steps of the DDM process easier, such as Pick and Place. Because the chip is now secured with the cured dielectric or adhesive fluid, the mechanical fitment of the chip does not need to be tight, which allows for easier Pick and Place operations.

FIG. 1A is a top view of a milled chip cavity and FIG. 1B is a perspective view of the milled chip cavity. The chip cavity 10 is obtained through milling. The cavity 10 has a perimeter which includes four sides 12 with each intersection between adjacent sides 12 being defined with a curve 14. As shown in FIG. 1B, this results in a cavity which has substantially cylindrical volumes at each corner. This geometry will allow a chip or other component to be more easily placed in the cavity and will allow for more fluid to be used to secure the chip or other component at the corners of the chip.

FIG. 2A is a top view showing a channel 16 milled into the perimeter of chip cavity 10 and FIG. 2B is a perspective view of the channel 16 milled into the perimeter of the chip cavity. The outside sides 18 now extend beyond the curve 14 such that the outside sides intersect at rounded corners 20.

Figure 3A:
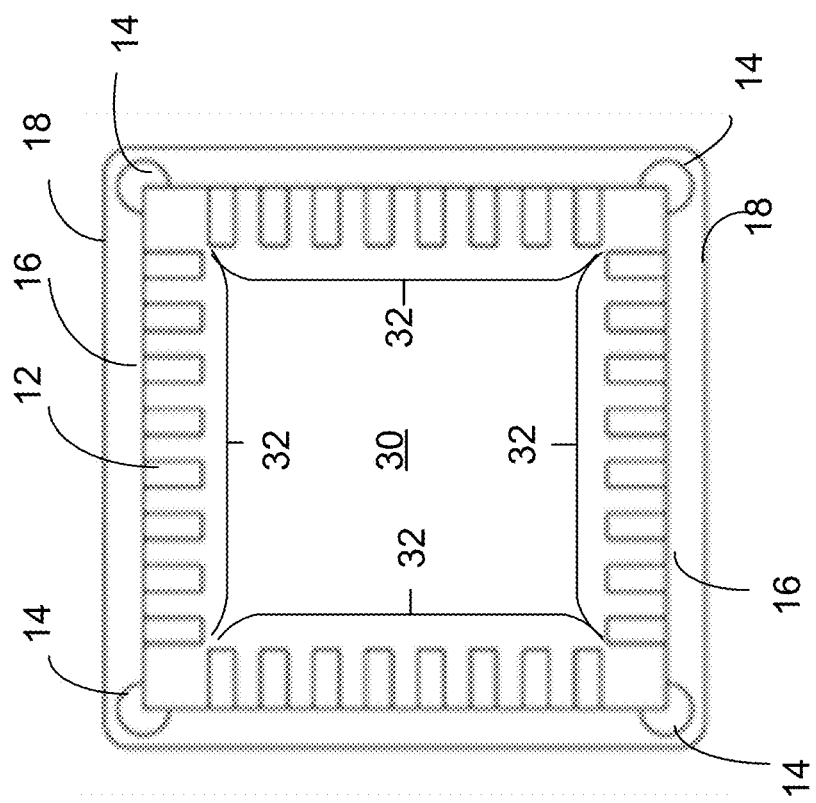
FIG. 3A is a top view showing a chip inserted into the cavity.

FIG. 3A is a top view showing a chip 30 inserted into the cavity and FIG. 3B is a perspective view showing the chip 30 inserted into the cavity. Note that the channel 16 extends around the chip 30. Thus, there is space between the outside edges of the chip 30 and the outside sides 18 of the cavity. The chip 30 has a component interface 32 to allow for interconnections with other components such as may be present on the same circuit board or other substrate.

Figure 4B:
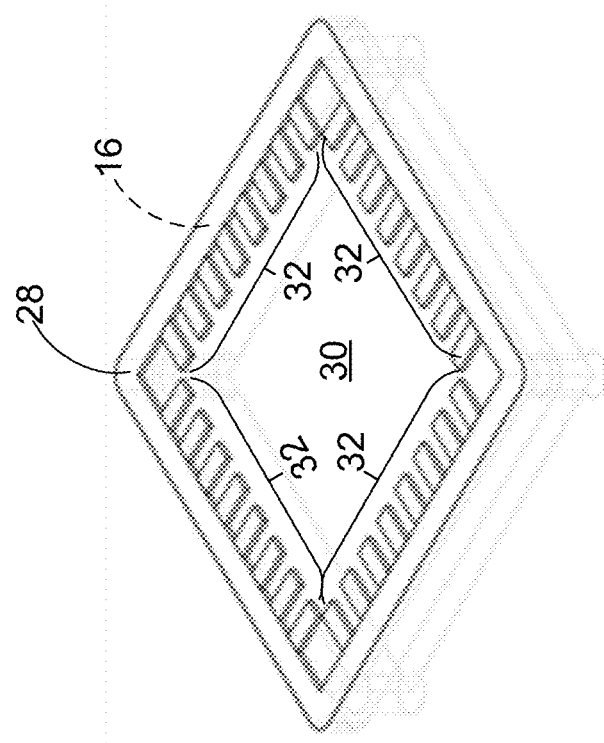
FIG. 4B is a perspective view showing of the channel filled with UV-curable dielectric fluid.
Figure 4A:
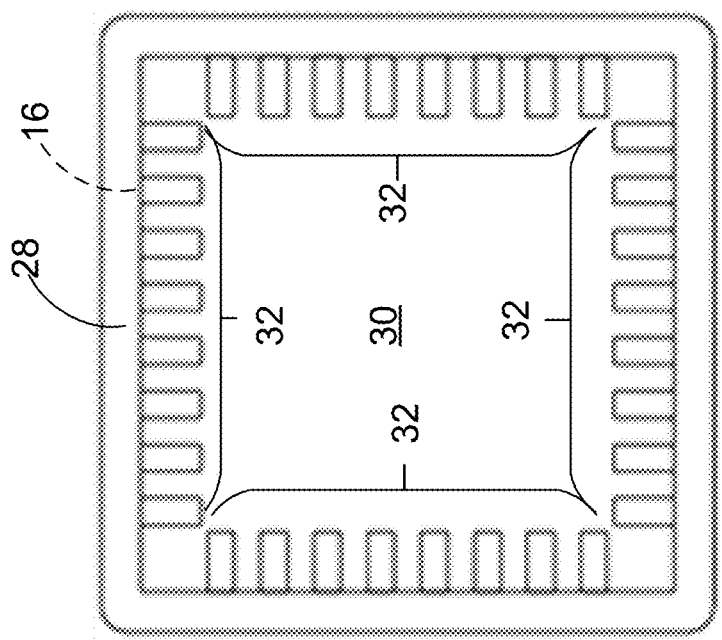
FIG. 4A is a top view of a channel filled with UV-curable dielectric fluid.

FIG. 4A is a top view of a channel filled with an ultra-violet (UV)-curable dielectric fluid. FIG. 4B is a perspective view showing the channel filled with UV-curable dielectric fluid. Here the channel 16 which extends around the chip 30 has been filled with the UV-curable dielectric fluid 28 such that there is no space between the chip and the cavity. Thus, after the electrical component is inserted into the cavity, UV-curable dielectric fluid may then be dispensed into the channel and cured in-situ with a UV lamp. In some embodiments, instead of using UV-curable dielectric fluid, an adhesive fluid may be used. The fluid 28 may be deposited in various ways including through use of a SMART PUMP available from nScrypt, Inc. (Orlando, Florida). The fill amount may be determined by the speed of the print tip and air pressure behind the material syringe, both of which may be chosen by the operator based on prior printing experience. If the fill is too low, additional fill routines are executed. If the fill is too high, excess UV dielectric may be wiped away by the operator. Alternatively, automated methods for determining the fill amount may be used.

FIG. 5A is a top view of chip interconnects 40 dispensed over a UV-cured channel 16. FIG. 5B is a perspective view of the chip interconnects 40 dispensed over the UV-cured channel. Note that the interconnects 40 are then printed using conductive ink such as silver ink starting from the component interface 32 of the chip 30 or other electronic component, across the cured dielectric threshold (formed form the fluid or liquid 28), and onto the adjoining board and connected to relevant traces.

FIG. 6 is a cross-sectional view showing the milled chip cavity 10 within a plastic structure 38 with the channel milled into the perimeter of the chip cavity such as shown in FIGS. 2A and 2B.

Figure 7:
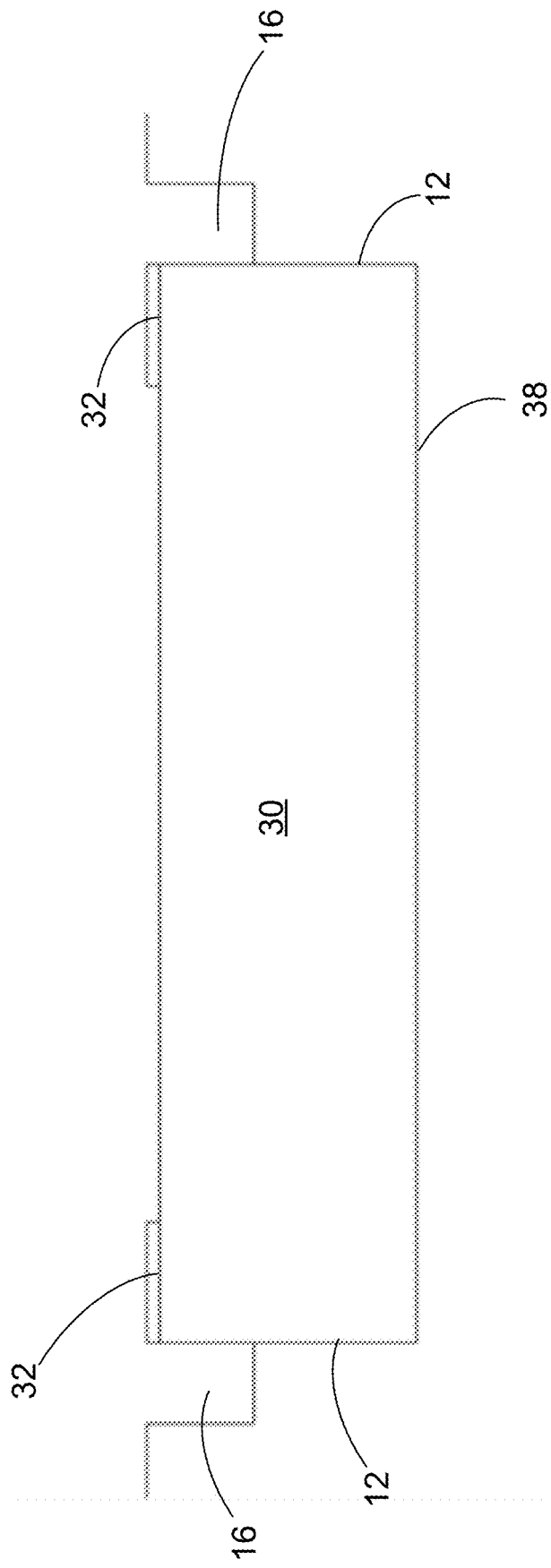
FIG. 7 is a cross sectional view showing the milled chip cavity with the chip inserted into the cavity and prior to the channel being filled with dielectric fluid.

FIG. 7 is a cross sectional view showing the milled chip cavity within a plastic or other structure 38 with the chip 30 inserted into the cavity and prior to the channel 16 being filled with dielectric fluid. The chip 30 has a component interface 32 for use in making inter connections with other components such as may be present on the same circuit board or other substrate.

Figure 8:
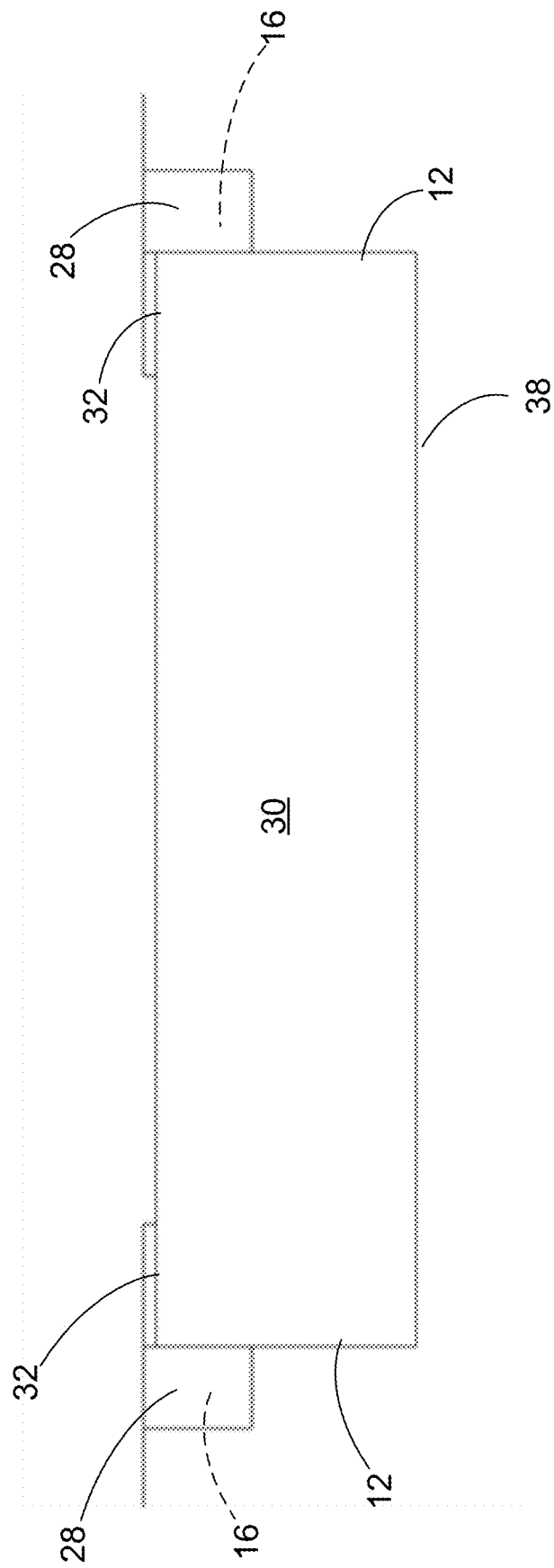
FIG. 8 is a cross sectional view showing the milled chip cavity with the chip inserted into the cavity and the channel filled with dielectric fluid.

FIG. 8 is a cross sectional view showing the milled chip cavity with the chip 30 inserted into the cavity and the channel 16 filled with dielectric fluid 28.

Figure 9:
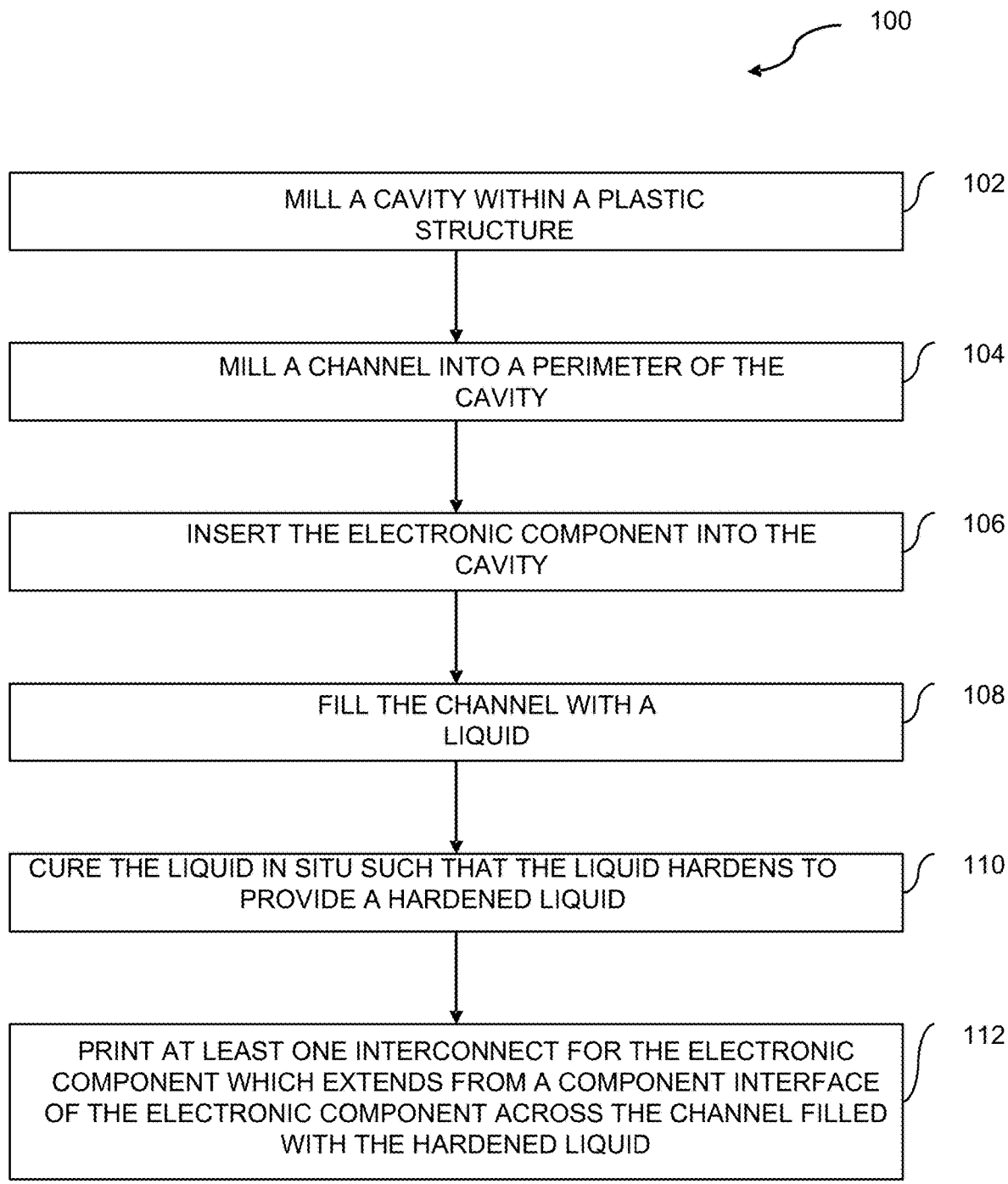
FIG. 9 illustrates one example of a flow diagram for a method.

FIG. 9 illustrate an example flow diagram of a method 100, according to one embodiment. The method 100 may include milling a cavity within a plastic structure at step 102. The method 100 may include milling a channel into a perimeter of the cavity at step 104. The method 100 may include inserting the electronic component into the cavity at step 106. The method may include filling the channel with a liquid at step 108. The method 100 may include curing the liquid in situ such that the liquid hardens to provide a hardened liquid at step 110. Where the liquid is a UV-curable dielectric fluid, the liquid may be cured using a UV-lamp. The liquid may be an adhesive and may be cured by exposing to the atmosphere. The method 100 may include printing, using a conductive material such as silver, at least one interconnect for the electronic component which extends from a component interface of the electronic component across the channel filled with the hardened liquid at step 112.

It is to be understood that the chip 30 is one example of an electronic component which may be used. It is to be understood that any number of different types of electronic components may be used which may have any number of different types of packaging. Examples of electronic components include, without limitation, active components, passive components, bare die components, optical components, electromechanical devices, sensors, and other types of electronic components. The methodology shown and described allows for securing the component in a manner which provides a tight platform to directly print conductive lines to the electronic components pads or other elements of a component interface thereby enhancing ruggedness and improving interconnects. Such a methodology may be especially advantageous for apparatus which are subject to harsh operating conditions and would have increased risk of failure if not for the methodology described herein.

The invention is not to be limited to the particular embodiments described herein. In particular, the invention contemplates numerous variations in the type of component, the manner in which the fluid is provided, the type of curing, the manner in which the cavity and/or channel are formed such as by printing, milling, or other additive or subtractive processes, and other variations. The foregoing description has been presented for purposes of illustration and description. It is not intended to be an exhaustive list or limit any of the invention to the precise forms disclosed. It is contemplated that other alternatives or exemplary aspects are considered included in the invention. The description is merely examples of embodiments, processes or methods of the invention. It is understood that any other modifications, substitutions, and/or additions can be made, which are within the intended spirit and scope of the invention.

What is claimed is:

1. A method for securely mounting an electronic component, the method comprising:
   forming a cavity within a plastic structure and a channel positioned at a perimeter of the cavity;
   inserting the electronic component into the cavity;
   filling the channel with a liquid;
   curing the liquid in situ such that the liquid hardens to provide a hardened liquid;
   direct printing, using a direct digital manufacturing machine, a conductive material to form at least one interconnect for the electronic component which extends from a component interface of the electronic component across the channel filled with the hardened liquid.

2. The method of claim 1 further comprising direct printing the plastic structure.

3. The method of claim 1 wherein the forming the cavity within the plastic structure is performed by milling.

4. The method of claim 3 wherein the channel positioned within the perimeter of the cavity is formed by milling.

5. The method of claim 1 wherein the channel extends annularly around the cavity.

6. The method of claim 1 wherein the milling the cavity within the plastic structure comprises milling the cavity within the plastic structure such that the perimeter of the cavity includes four sides with curves connecting adjacent sides.

7. The method of claim 1 wherein the liquid forms a dielectric material when cured.

8. The method of claim 1 wherein the liquid comprises an adhesive.

9. The method of claim 1 wherein the liquid is dispensed in the cavity before inserting the electronic component into the cavity and wherein the inserting the electronic component into the cavity causes the liquid dispensed in the cavity to seep upwards thereby filling the channel with the liquid.

10. The method of claim 1 wherein the liquid is dispensed on an underside of the electronic component and wherein the inserting the electronic component into the cavity causes the liquid dispensed on the underside of the electronic component to seep upwards thereby filling the channel with the liquid.

11. The method of claim 1 wherein the cavity is a shallow cavity such that the electronic component extends above the cavity and the method further comprising direct printing a ramp and wherein the at least one interconnect is printed on the ramp.

12. The method of claim 1 using a laser to remove unwanted portions of the conductive material to provide clean edges for the at least one interconnect.

13. An apparatus manufactured using the method of claim 1.

14. A method for mounting an electronic component, the method comprising:
   milling a cavity within a plastic structure;
   milling a channel into a perimeter of the cavity;
   inserting the electronic component into the cavity;
   dispensing a fluid into the channel at the perimeter of the cavity, the fluid forming a dielectric material when cured;
   curing the fluid in situ to secure the electronic component within the cavity with a cured dielectric;
   using a direct digital manufacturing machine to print interconnects for the electronic component wherein the interconnects extend from a component interface of the electronic component across the channel filled with the cured dielectric.

15. The method of claim 14 wherein the dielectric fluid is an ultra-violet (UV)-curable dielectric fluid and wherein the curing the dielectric fluid is performed using a UV lamp.

16. The method of claim 14 wherein the inserting the electronic component into the cavity is performed using a pick and place machine.

17. The method of claim 14 wherein the component is selected from a set consisting of a chip, a die, a MEMS device, a sensor, a passive component, and an active component.

18. The method of claim 14 wherein the channel extends annularly around the cavity.

19. The method of claim 14 wherein the milling the cavity within the plastic structure comprises milling the cavity within the plastic structure such that the perimeter of the cavity includes four sides with curves connecting adjacent sides.

20. The method of claim 14 further comprising directing printing the plastic structure.

21. The method of claim 14 wherein the method is performed with direct digital manufacturing.

22. An apparatus manufactured using the method of claim 14.

* * * * *